(12) United States Patent
Hatakeyama et al.

(10) Patent No.: US 7,517,724 B2
(45) Date of Patent: Apr. 14, 2009

(54) DICING/DIE BONDING SHEET

(75) Inventors: Keiichi Hatakeyama, Tsukuba (JP);
Michio Uruno, Ichihara (JP); Takayuki Matsuzaki, Ichihara (JP); Yasumasa Morishima, Yokohama (JP); Kenji Kita, Nisshin (JP); Shinichi Ishiwata, Isehara (JP)

(73) Assignees: Hitachi Chemical Company, Ltd., Tokyo (JP); Furukawa Electric Co., Ltd., Tokyo (JP)

( * ) Notice: Subject to any disclaimer, the term of this patent is extended or adjusted under 35 U.S.C. 154(b) by 405 days.

(21) Appl. No.: 10/556,535

(22) PCT Filed: Mar. 15, 2005

(86) PCT No.: PCT/JP2005/004513

§ 371 (c)(1),
(2), (4) Date: Nov. 14, 2005

(87) PCT Pub. No.: WO2005/088700

PCT Pub. Date: Sep. 22, 2005

(65) Prior Publication Data

US 2007/0026572 A1 Feb. 1, 2007

(30) Foreign Application Priority Data

Mar. 15, 2004 (JP) ............................. 2004-072528

(51) Int. Cl.
*H01L 21/00* (2006.01)
(52) U.S. Cl. ........................................ 438/114; 438/113
(58) Field of Classification Search .................. 438/113, 438/114
See application file for complete search history.

(56) References Cited

U.S. PATENT DOCUMENTS 5,304,418 A  4/1994 Akada et al.
(Continued)

FOREIGN PATENT DOCUMENTS

EP  0 359 373  3/1990
(Continued)

OTHER PUBLICATIONS

Chinese Official Action for Application No. 2005800005112, dated Oct. 26, 2007.
(Continued)

*Primary Examiner*—Matthew Smith
*Assistant Examiner*—Colleen E Rodgers
(74) *Attorney, Agent, or Firm*—Antonelli, Terry, Stout & Kraus, LLP.

(57) ABSTRACT

The present invention provides a dicing/die bonding sheet which can be used as a dicing tape during dicing, enables ready separation of the semiconductor element and the adhesive layer from the pressure-sensitive adhesive layer during pickup, and in which the adhesive layer has satisfactory adhesiveness as a die bonding material. A dicing/die bonding sheet in which the pressure-sensitive adhesive layer comprises a compound (A), containing intramolecular, radiation curable carbon-carbon double bonds with an iodine value of 0.5 to 20, and at least one compound (B) selected from a group consisting of polyisocyanates, melamine-formaldehyde resins, and epoxy resins, and the adhesive layer comprises an epoxy resin (a), a phenolic resin (b) with a hydroxyl equivalent of at least 150 g/eq., an epoxy group-containing acrylic copolymer (c), comprising from 0.5 to 6% by weight of glycidyl acrylate or glycidyl methacrylate, and with a weight average molecular weight of at least 100,000, a filler (d), and a curing accelerator (e).

15 Claims, 2 Drawing Sheets

U.S. PATENT DOCUMENTS

| | | |
|---|---|---|
| 5,476,565 A | 12/1995 | Akada et al. |
| 2003/0145949 A1 | 8/2003 | Tanaka et al. |

FOREIGN PATENT DOCUMENTS

| | | |
|---|---|---|
| JP | 2-32181 | 2/1990 |
| JP | 7-29860 | 1/1995 |
| JP | 7-29861 | 1/1995 |
| JP | 8-53655 | 2/1996 |
| JP | 2001-181586 | 7/2001 |
| JP | 2002-158276 | 5/2002 |
| JP | 2002-226796 | 8/2002 |
| JP | 2003-301148 | 10/2003 |

OTHER PUBLICATIONS

Korean Official Action dated Oct. 27, 2006.
Search Report, for Application No. SG 2000507528-8, issued Mar. 30, 2006.
Written Opinion, for Application No. SG 2000507528-8, issued Mar. 30, 2006.
Official Action issued Nov. 20, 2007, in a counterpart Taiwanese application.

DICING/DIE BONDING SHEET

TECHNICAL FIELD

The present invention relates to a dicing/die bonding sheet used in both a dicing process, in which a semiconductor wafer is cut and separated into semiconductor elements, and a die bonding process, in which the semiconductor elements are bonded to support members.

BACKGROUND ART

In recent years, wafer backside laminating methods have been widely used as a process for cutting and separating (dicing) semiconductor wafers that have been produced with a large diameter into smaller semiconductor elements (semiconductor chips), and then bonding (die bonding) each of these semiconductor elements onto a support member such as a lead frame or an organic substrate.

When a semiconductor device is manufactured by a wafer backside laminating method, using a film adhesive, then as shown in FIG. 3, first, (1) a film adhesive 11 is laminated to the backside of a semiconductor wafer 10, and then (2) a dicing tape 14, comprising a pressure-sensitive adhesive layer 12 disposed on a base film 13, is laminated to the other side of the film adhesive, (3) the semiconductor wafer is divided into individual semiconductor elements by dicing, and (4) each individual semiconductor element is picked up with the film adhesive, bonded (die bonded) to a support member, and then subjected to a series of processes such as the wiring of metal wire 15, and heat curing, thereby forming a semiconductor device 16.

Furthermore, an alternative method is an individual film bonding method. In this individual film bonding method, (1) a lone film adhesive is cut into individual sections, (2) each individual section of the film adhesive is bonded to a support, and (3) an individual semiconductor element produced by dicing is bonded (die bonded) to the film adhesive bonded to the support member, and then subjected to a series of processes such as the wiring of metal wire, and heat curing, thereby forming a semiconductor device.

In the wafer backside laminating method described above, because the semiconductor wafer the film adhesive are diced simultaneously, and a semiconductor element with a film adhesive is then bonded to a support member, a separate apparatus for dicing the film adhesive and then bonding each individual section of film adhesive to a support member is not needed, meaning a conventional silver paste assembly apparatus can be used, either as is, or with improvements made to portions of the apparatus such as the addition of a hot plate. As a result, amongst the various assembly methods using film adhesives, wafer backside laminating is attracting considerable attention as a method that enables comparatively cheap manufacturing costs.

However, in a method that employs a film adhesive using a wafer backside laminating method, because two bonding steps, that is, a step for bonding together the film adhesive and the dicing tape, and then a step for bonding the resulting laminated film to the backside of a semiconductor wafer, are required prior to the dicing step, further simplification of the operation is still being sought. Films in which the pressure-sensitive adhesive layer and the adhesive layer have been incorporated into a single layer have been proposed as films capable of achieving such a simplification (for example, Japanese Laid-Open Publication No. Hei 2-32181 and Japanese Laid-Open Publication No. Hei 8-53655).

Furthermore, another possible method involves preparing an integrated sheet in which a film adhesive has been provided on a dicing tape (hereafter, this type of sheet is referred to as a dicing/die bonding sheet), and then laminating this sheet to a wafer. However, with an integrated dicing/die bonding sheet comprising a film adhesive provided on a dicing tape, because the period between manufacture and use of the sheet, during which time the adhesive layer of the film adhesive is in contact with the pressure-sensitive adhesive layer of the dicing sheet, is inevitably long, a problem arises in that the two layers interact, meaning that during the process for picking up individual semiconductor elements with the film adhesive laminated thereto, the film adhesive and the dicing tape may not separate satisfactorily.

DISCLOSURE OF INVENTION

Accordingly, an object of the present invention is to provide a dicing/die bonding sheet which can be laminated to a semiconductor wafer and used as a dicing tape during dicing, enables ready separation of the semiconductor element and the adhesive layer from the pressure-sensitive adhesive layer during pickup, and in which the adhesive layer has satisfactory adhesiveness as a die bonding material.

The present invention relates to a dicing/die bonding sheet comprising a pressure-sensitive adhesive layer and an adhesive layer formed, in that order, on a base film, wherein the pressure-sensitive adhesive layer comprises a compound (A), containing intramolecular, radiation curable carbon-carbon double bonds with an iodine value of 0.5 to 20, and at least one compound (B) selected from a group consisting of polyisocyanates, melamine-formaldehyde resins, and epoxy resins, and the adhesive layer comprises an epoxy resin (a), a phenolic resin (b) with a hydroxyl equivalent of at least 150 g/eq., an epoxy group-containing acrylic copolymer (c), comprising from 0.5 to 6% by weight of glycidyl acrylate or glycidyl methacrylate, and with a weight average molecular weight of at least 100,000, a filler (d), and a curing accelerator (e).

Furthermore, the present invention also relates to the above dicing/die bonding sheet, wherein the glass transition temperature of the compound (A) is within a range from −70° C. to 0° C.

Furthermore, the present invention also relates to the above dicing/die bonding sheet, wherein the hydroxyl value of the compound (A) is within a range from 5 to 100.

In addition, the present invention also relates to the above dicing/die bonding sheet, wherein the acid value of the compound (A) is within a range from 0.5 to 30.

Furthermore, the present invention also relates to the above dicing/die bonding sheet, wherein the hydroxyl value of the compound (A) is within a range from 5 to 100, and the acid value is within a range from 0.5 to 30.

In addition, the present invention also relates to the above dicing/die bonding sheet, wherein if the combined weight of the epoxy resin (a) and the phenolic resin (b) is termed X, and the weight of the epoxy group-containing acrylic copolymer (c) is termed Y, then the ratio X/Y is within a range from 0.24 to 1.

Furthermore, the present invention also relates to the above dicing/die bonding sheet, wherein the phenolic resin (b) is represented by a general formula (I):

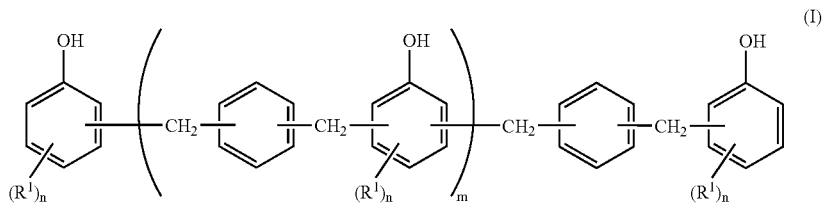

(wherein, the groups $R^1$ may be the same or different, and each represents a hydrogen atom, a straight chain or branched alkyl group of 1 to 10 carbon atoms, a cyclic alkyl group, an aralkyl group, an alkenyl group, a hydroxyl group, an aryl group, or a halogen atom, n represents an integer from 1 to 3, and m represents an integer from 0 to 50).

Furthermore, the present invention also relates to the above dicing/die bonding sheet, wherein the average particle diameter of the filler (d) is within a range from 0.005 μm to 0.1 μm.

Furthermore, the present invention also relates to the above dicing/die bonding sheet, wherein the filler (d) is a silica filler.

In addition, the present invention also relates to the above dicing/die bonding sheet, wherein the curing accelerator (e) is an imidazole.

The present disclosure relates to subject matter contained in Japanese Patent Application No. 2004-72528, filed on Mar. 15, 2004, the disclosure of which is expressly incorporated herein by reference in its entirety.

BEST MODE FOR CARRYING OUT THE INVENTION

Figure 1:
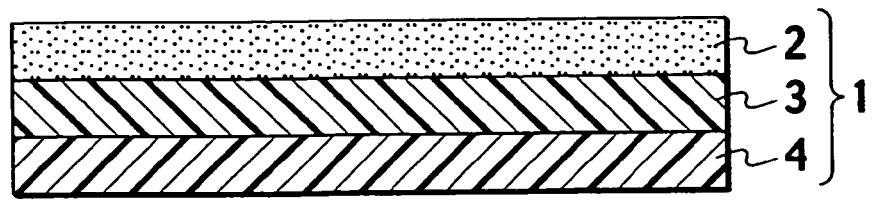
FIG. 1 is a cross-sectional schematic illustration of a dicing/die bonding sheet of the present invention.

As shown in FIG. 1, a dicing/die bonding sheet 1 of the present invention comprises a structure in which a pressure-sensitive adhesive layer 3 and an adhesive layer 2 are provided, in that order, on the surface of a base film 4. Each of the layers may be precut to a predetermined shape in accordance with the processes or apparatus used, and a cover film, which is not shown in the figure, may also be provided to protect the adhesive layer and/or the pressure-sensitive adhesive layer. Furthermore, a dicing/die bonding sheet of the present invention may be cut for each individual semiconductor wafer, or may be provided as a long rolled sheet. As follows is a description of each of the features of a dicing/die bonding sheet of the present invention.

<Pressure-Sensitive Adhesive Layer>

In a dicing/die bonding sheet of the present invention, the pressure-sensitive adhesive layer is formed from an acrylic-based pressure-sensitive adhesive comprising a compound (A), containing intramolecular, radiation curable carbon-carbon double bonds with an iodine value of 0.5 to 20, and at least one compound (B) selected from a group consisting of polyisocyanates, melamine-formaldehyde resins, and epoxy resins. Here, the term "radiation" refers to either light such as ultraviolet light, or ionized radiation such as an electron beam.

First is a description of the compound (A), which represents one of the main components of the pressure-sensitive adhesive layer. In the present invention, the quantity of radiation curable carbon-carbon double bonds contained within the compound (A), as an iodine value, is typically within a range from 0.5 to 20, and preferably from 0.8 to 10. Ensuring that the iodine value is at least 0.5 enables a reduction in adhesion to be achieved following irradiation, while provided the iodine value is no more than 20, the fluidity of the pressure-sensitive adhesive following irradiation remains satisfactory, and a satisfactory spacing can be achieved between elements following stretching, meaning the problem that can arise during pickup due to a deterioration in the image recognition of individual elements can be suppressed. In addition, the compound (A) itself is stable, and production is simple.

The above compound (A) preferably has a glass transition temperature within a range from −70° C. to 0° C., and even more preferably from −66° C. to −28° C. Provided the glass transition temperature (hereafter, also abbreviated as Tg) is −70° C. or higher, the heat resistance of the compound relative to the heat generated during irradiation is satisfactory, and provided the value is no more than 0° C., a satisfactory shatter prevention effect can be achieved for diced elements formed on a wafer with a rough surface.

Although the aforementioned compound (A) can be produced by any appropriate method, one suitable example involves the reaction of a compound ((1)) such as an acrylic-based copolymer or a methacrylic-based copolymer, containing radiation curable carbon-carbon double bonds and also containing functional groups, with a compound ((2)) containing a functional group capable of reacting with these functional groups.

Of these reactants, the compound ((1)) containing radiation curable carbon-carbon double bonds and other functional groups can be obtained by copolymerizing a monomer ((1)-1) containing a radiation curable carbon-carbon double bond, such as an alkyl acrylate or an alkyl methacrylate, with a monomer ((1)-2) containing the functional group.

Examples of the monomer ((1)-1) include monomers of 6 to 12 carbon atoms such as hexyl acrylate, n-octyl acrylate, isooctyl acrylate, 2-ethylhexyl acrylate, dodecyl acrylate, and decyl acrylate, and monomers of no more than 5 carbon atoms such as pentyl acrylate, n-butyl acrylate, isobutyl acrylate, ethyl acrylate, and methyl acrylate, as well as the corresponding methacrylates of the above compounds.

The larger the number of carbon atoms within the monomer ((1)-1), the lower the glass transition temperature will become, thus enabling a compound with the desired glass transition temperature to be produced. Furthermore, in order to improve the miscibility and various performance factors other than the glass transition temperature, low molecular weight compounds containing a carbon-carbon double bond, such as vinyl acetate, styrene, or acrylonitrile, can also be blended with the monomer, provided the quantity amounts to more than 5% by weight of the total weight of the monomer ((1)-1).

Examples of the functional group within the monomer ((1)-2) include a carboxyl group, hydroxyl group, amino group, cyclic acid anhydride group, epoxy group, or isocyanate group. Specific examples of the monomer ((1)-2) include acrylic acid, methacrylic acid, cinnamic acid, itaconic acid, fumaric acid, phthalic acid, 2-hydroxyalkyl acrylates, 2-hydroxyalkyl methacrylates, glycol monoacrylates, glycol monomethacrylates, N-methylolacrylamide, N-methylolmethacrylamide, allyl alcohol, N-alkylaminoethyl acrylates, N-alkylaminoethyl methacrylates, acrylamides, methacrylamides, maleic anhydride, itaconic anhydride, fumaric anhydride, phthalic anhydride, glycidyl acrylate, glycidyl methacrylate, allyl glycidyl ether, and polyisocyanate compounds in which a portion of the isocyanate groups have undergone urethanization with a monomer containing a hydroxyl group or a carboxyl group, and a radiation curable carbon-carbon double bond.

In the compound ((2)), examples of the functional group include a hydroxyl group, epoxy group, or isocyanate group or the like in those cases where the functional group of the compound ((1)), that is, the functional group of the monomer ((1)-2), is a carboxyl group or a cyclic acid anhydride group, a cyclic acid anhydride group or isocyanate group or the like in those cases where the functional group of the monomer ((1)-2) is a hydroxyl group, an epoxy group or isocyanate group or the like in those cases where the functional group of the monomer ((1)-2) is an amino group, or a carboxyl group, cyclic acid anhydride group, or amino group or the like in those cases where the functional group of the monomer ((1)-2) is an epoxy group. Specific examples include the same compounds presented above as specific examples of the monomer ((1)-2).

In the reaction between the compound ((1)) and the compound ((2)), a material that satisfies the acid value or hydroxyl value characteristics prescribed by the present invention can be produced by leaving some residual unreacted functional groups.

In the synthesis of the aforementioned compound (A), examples of suitable organic solvents for those cases where the reaction is conducted as a solution polymerization include ketones, esters, alcohols, and aromatic solvents, and of these, typical good solvents for acrylic-based polymers, with a boiling point within a range from 60 to 120° C., such as toluene, ethyl acetate, isopropyl alcohol, benzene, methyl cellosolve, ethyl cellosolve, acetone, and methyl ethyl ketone, are preferred. The polymerization initiator generally uses a radical generator, and examples include azobis-based initiators such as $\alpha,\alpha'$-azobisisobutyronitrile, and organic peroxide-based initiators such as benzoyl peroxide. If required, a catalyst or polymerization inhibitor can also be added, and a compound (A) of the desired molecular weight can be produced by adjusting the polymerization temperature and the polymerization time. In terms of regulating the molecular weight, the use of mercaptan or carbon tetrachloride-based solvents is preferred. This reaction is not limited to solution polymerization, and may also be conducted using a different method such as bulk polymerization or suspension polymerization.

The compound (A) can be obtained in the manner described above. In the present invention, the molecular weight of the compound (A) is preferably within a range from 300,000 to 1,000,000. At molecular weights less than 300,000, the cohesive strength imparted by the irradiation decreases, which increases the likelihood of element displacement when the wafer is diced, and can cause image recognition problems. In order to better prevent this element displacement, the molecular weight is preferably 400,000 or greater. If the molecular weight exceeds 1,000,000, then the compound may gel during synthesis or application. Molecular weight values in the present invention refer to polystyrene equivalent average molecular weights.

The compound (A) preferably comprises sufficient OH groups to generate a hydroxyl value within a range from 5 to 100, as this reduces the adhesion following irradiation, thus enabling a further reduction in the danger of pickup misses. Furthermore, the compound (A) preferably also comprises sufficient COOH groups to generate an acid value within a range from 0.5 to 30.

If the hydroxyl value of the compound (A) is too low, then the adhesion reduction effect following irradiation is insufficient, whereas if too high, the pressure-sensitive adhesive tends to lose fluidity following irradiation. If the acid value is too low, then the improvement in the tape restoration characteristics is insufficient, whereas if too high, the pressure-sensitive adhesive tends to lose fluidity.

Next is a description of the compound (B), which represents the other main component of the pressure-sensitive adhesive layer. The compound (B) is at least one compound selected from a group consisting of polyisocyanates, melamine-formaldehyde resins, and epoxy resins, and can use either a single compound, or a combination of 2 or more different compounds. This compound (B) functions as a cross-linking agent, and cross-linking structures formed as a result of reaction with the compound (A) or the base film enable the cohesive strength of the pressure-sensitive adhesive layer, comprising the compound (A) and the compound (B) as its main components, to increase following application of the pressure-sensitive adhesive.

There are no particular restrictions on the polyisocyanate, and suitable examples include aromatic isocyanates such as 4,4'-diphenylmethane diisocyanate, tolylene diisocyanate, xylylene diisocyanate, 4,4'-diphenylether diisocyanate, and 4,4'-[2,2-bis(4-phenoxyphenyl)propane] diisocyanate, as well as hexamethylene diisocyanate, 2,2,4-trimethylhexamethylene diisocyanate, isophorone diisocyanate, 4,4'-dicyclohexylmethane diisocyanate, 2,4'-dicyclohexylmethane diisocyanate, lysine diisocyanate, and lysine triisocyanate. A specific example of a commercially available product that can be used is Coronate L.

Furthermore, specific examples of commercially available melamine-formaldehyde resins that can be used include Nikalac MX-45 (manufactured by Sanwa Chemical Co., Ltd.) and Melan (manufactured by Hitachi Chemical Co., Ltd.). In addition, examples of suitable epoxy resins include Tetrad-X (a registered trademark, manufactured by Mitsubishi Chemical Corporation). In the present invention, the use of polyisocyanates is particularly preferred.

The quantity added of (B) is preferably within a range from 0.1 to 10 parts by weight, and even more preferably from 0.4 to 3 parts by weight, per 100 parts by weight of the compound (A). If this quantity is less than 0.1 parts by weight, then the improvement in cohesive strength tends to be inadequate, whereas if the quantity exceeds 10 parts by weight, the curing reaction tends to proceed rapidly, resulting in the formation of cross-linked structures, during the blending of the pressure-sensitive adhesive or the subsequent application operation, meaning a deterioration in workability.

Furthermore, in the present invention, the pressure-sensitive adhesive layer preferably also incorporates a photopolymerization initiator (C). There are no particular restrictions on the photopolymerization initiator (C) incorporated within the pressure-sensitive adhesive layer, and conventional compounds can be used. Suitable examples include benzophenones such as benzophenone, 4,4'-dimethylaminobenzophenone, 4,4'-diethylaminobenzophenone, and 4,4'-dichlorobenzophenone, acetophenones such as acetophenone and diethoxyacetophenone, anthraquinones such as 2-ethylanthraquinone and t-butylanthraquinone, as well as 2-chlorothioxanthone, benzoin ethyl ether, benzoin isopropyl ether, benzil, 2,4,5-triarylimidazole dimers (lophine dimer), and acridine-based compounds, and these initiators can be used either singularly, or in combinations of two or more different compounds.

The quantity added of (C) is preferably within a range from 0.01 to 5 parts by weight, and even more preferably from 0.01 to 4 parts by weight, per 100 parts by weight of the compound (A).

In addition, adhesion imparting agents, adhesion regulators, surfactants, and other modifiers and conventional components can also be blended into the radiation curable pressure-sensitive adhesive used in the present invention according to need. Although there are no particular restrictions on the thickness of the pressure-sensitive adhesive layer, it is typically within a range from 2 to 50 µm.

<Adhesive Layer>

In a dicing/die bonding sheet of the present invention, the adhesive layer is formed from a composition comprising an epoxy resin (a), a phenolic resin (b) with a hydroxyl equivalent of at least 150 g/eq., an epoxy group-containing acrylic copolymer (c), comprising from 0.5 to 6% by weight of glycidyl acrylate or glycidyl methacrylate, and with a weight average molecular weight of at least 100,000, a filler (d), and a curing accelerator (e). As follows is a description of each of these components.

There are no particular restrictions on the epoxy resin (a) used in the present invention, provided it exhibits an adhesive action on curing. An epoxy resin containing two or more functional groups, and preferably having a molecular weight of less than 5,000, and even more preferably less than 3,000, can be used. Furthermore, the epoxy resin preferably has a molecular weight of at least 500, and even more preferably at least 800.

Examples of this type of epoxy resin include bifunctional epoxy resins and novolak epoxy resins such as bisphenol A type epoxy resins, bisphenol F type epoxy resins, bisphenol S type epoxy resins, alicyclic epoxy resins, aliphatic chain-based epoxy resins, phenol novolak type epoxy resins, cresol novolak type epoxy resins, bisphenol A novolak type epoxy resins, diglycidyl etherified products of biphenol, diglycidyl etherified products of naphthalenediol, diglycidyl etherified products of phenols, and diglycidyl etherified products of alcohols, as well as alkyl substituted, halogenated, or hydrogenated versions of the above materials. Furthermore, generally known polyfunctional epoxy resins and heterocycle-containing epoxy resins can also be used. These resins can be used either singularly, or in combinations of two or more different resins. In addition, the resin may also contain non-epoxy resin components as impurities, provided those components do not impair the characteristics of the resin.

Specific examples of commercially available epoxy resins include bisphenol A type epoxy resins such as Epikote 807, Epikote 815, Epikote 825, Epikote 827, Epikote 828, Epikote 834, Epikote 1001, Epikote 1002, Epikote 1003, Epikote 1055, Epikote 1004, Epikote 1004AF, Epikote 1007, Epikote 1009, Epikote 1003F and Epikote 1004F (brand names, all manufactured by Japan Epoxy Resins Co., Ltd.), DER-330, DER-301, DER-361, DER-661, DER-662, DER-663U, DER-664, DER-664U, DER-667, DER-642U, DER-672U, DER-673MF, DER-668 and DER-669 (brand names, all manufactured by Dow Chemical Company), YD8125 and YDF8170 (brand names, manufactured by Tohto Kasei Co., Ltd.); bisphenol F type epoxy resins such as YDF-2004 (brand name, manufactured by Tohto Kasei Co., Ltd.); phenol novolak type epoxy resins such as Epikote 152 and Epikote 154 (brand names, manufactured by Japan Epoxy Resins Co., Ltd.), EPPN-201 (brand name, manufactured by Nippon Kayaku Co., Ltd.) and DEN-438 (brand name, manufactured by Dow Chemical Company); cresol novolak type epoxy resins such as Epikote 180S65 (brand name, manufactured by Japan Epoxy Resins Co., Ltd.), Araldite ECN1273, Araldite ECN1280 and Araldite ECN1299 (brand names, all manufactured by Ciba Specialty Chemicals Inc.), YDCN-701, YDCN-702, YDCN-703 and YDCN-704 (brand names, all manufactured by Tohto Kasei Co., Ltd.), EOCN-102S, EOCN-103S, EOCN-104S, EOCN-1012, EOCN-1020, EOCN-1025 and EOCN-1027 (brand names, all manufactured by Nippon Kayaku Co., Ltd.), ESCN-195X, ESCN-200L and ESCN-220 (brand names, manufactured by Sumitomo Chemical Co., Ltd.); polyfunctional epoxy resins such as Epon 1031S, Epikote 1032H60 and Epikote 157S70 (brand names, all manufactured by Japan Epoxy Resins Co., Ltd.), Araldite 0163 (brand name, manufactured by Ciba Specialty Chemicals Inc.), Denacol EX-611, Denacol EX-614, Denacol EX-614B, Denacol EX-622, Denacol EX-512, Denacol EX-521, Denacol EX-421, Denacol EX-411 and Denacol EX-321 (brand names, all manufactured by Nagase Chemicals Ltd.), EPPN501H and EPPN502H (brand names, manufactured by Nippon Kayaku Co., Ltd.); amine type epoxy resins such as Epikote 604 (brand name, manufactured by Japan Epoxy Resins Co., Ltd.), YH-434 (brand name, manufactured by Tohto Kasei Co., Ltd.), Tetrad-X and Tetrad-C (brand names, manufactured by Mitsubishi Gas Chemical Company, Inc.) and ELM-120 (brand name, manufactured by Sumitomo Chemical Co., Ltd.); heterocycle-containing epoxy resins such as Araldite PT810 (brand name, manufactured by Ciba Specialty Chemicals Inc.); and alicyclic epoxy resins such as ERL4234, ERL4299, ERL4221 and ERL4206 (brand names, all manufactured by Union Carbide Corporation), and these resins can be used either singularly, or in combinations of two or more different resins.

In the present invention, from the viewpoint of heat resistance, the use of an epoxy resin that is solid at room temperature, and has a softening point, as measured by a ring and ball method, of at least 50° C. is preferred, and the quantity of this epoxy resin preferably accounts for at least 20% by weight, and even more preferably 40% by weight or greater, and most preferably 60% by weight or greater, of the total weight of the epoxy resin (a). Commercially available examples of such epoxy resins include YDCN-703 and YDCN-704 (brand names, manufactured by Tohto Kasei Co., Ltd.), and Epikote 1004 and Epikote 1007 (brand names, manufactured by Japan Epoxy Resins Co., Ltd.).

Epoxy resins with a molecular weight of at least 600, and with a softening point of at least 50° C. have a large difference in polarity from the epoxy group-containing acrylic copolymer (c) described below, leading to poor miscibility between the two, and as a result, these types of epoxy resins are preferred.

Furthermore, in the present invention, the epoxy equivalent of the epoxy resin (a) is preferably within a range from 100 to 2,000 g/eq., and even more preferably from 150 to 1,000 g/eq., and most preferably from 150 to 300 g/eq. If the epoxy equivalent is less than 100 g/eq., then the cured product tends to becomes brittle, and the adhesiveness tends to deteriorate, whereas if the epoxy equivalent exceeds 2,000 g/eq., then Tg tends to fall, and the heat resistance tends to deteriorate.

Although there are no particular restrictions on the phenolic resin (b) provided the hydroxyl equivalent is at least 150 g/eq., novolak or resol type resins are preferred as they offer excellent electrolytic corrosion resistance when absorbing moisture. The hydroxyl equivalent is preferably within a range from 150 to 400 g/eq., and even more preferably from 180 to 300 g/eq., and most preferably from 180 to 250 g/eq. If the hydroxyl equivalent is less than 150 g/eq., then the coefficient of water absorption increases, and the reflow resistance tends to deteriorate, whereas if the hydroxyl equivalent exceeds 400 g/eq., then Tg tends to fall, and the heat resistance tends to deteriorate.

Specific examples of such a phenolic resin include the phenolic resins represented by a general formula (I) shown below:

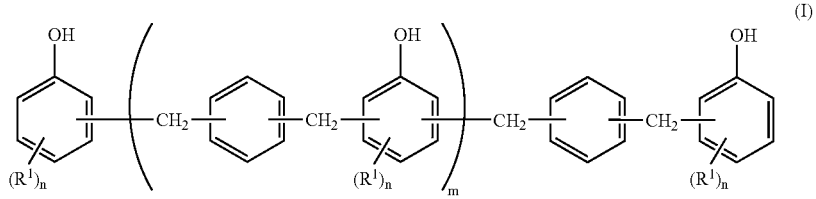

(wherein, the groups $R^1$ may be the same or different, and each represents a hydrogen atom, a straight chain or branched alkyl group of 1 to 10 carbon atoms, a cyclic alkyl group, an aralkyl group, an alkenyl group, a hydroxyl group, an aryl group, or a halogen atom, n represents an integer from 1 to 3, and m represents an integer from 0 to 50).

From the viewpoint of moisture resistance, the aforementioned phenolic resin (b) preferably exhibits a water absorption of no more than 2% by weight after standing for 48 hours in a thermo-humidistatic chamber at a temperature of 85° C. and a humidity of 85% RH. Furthermore, it is also preferable to use a phenolic resin that exhibits a weight loss by heating at 350° C. (temperature elevation rate: 5° C./min., atmosphere: nitrogen) of less than 5% by weight, as measured by a thermo-gravimetric analyzer (TGA), because such resins enable a suppression of the quantity of volatilized components generated during heating and processing, thereby improving the reliability of various properties such as the heat resistance and moisture resistance, and reducing the contamination of equipment caused by the volatile components during operations such as heating and processing.

A phenolic resin of the present invention represented by the formula (I) can be obtained by, for example, reacting a phenolic compound with a xylylene compound that functions as a bivalent linking group, in the absence or presence of an acid catalyst. Examples of commercially available products include, for example, the Milex XLC-series and Milex XL series (brand names, manufactured by Mitsui Chemicals Inc.).

The respective blend quantities of the aforementioned phenolic resin (b) and the epoxy resin (a), as a weight ratio of hydroxyl equivalent and epoxy equivalent, is preferably within a range from 0.70/0.30 to 0.30/0.70, even more preferably from 0.65/0.35 to 0.35/0.65, even more preferably from 0.60/0.40 to 0.40/0.60, and most preferably from 0.55/ 0.45 to 0.45/0.55. If the blend ratio falls outside the above range, the resulting adhesive may have poor curing properties.

Examples of the phenolic compound used for production of a phenolic resin of the formula (I) include phenol, o-cresol, m-cresol, p-cresol, o-ethylphenol, p-ethylphenol, o-n-propylphenol, m-n-propylphenol, p-n-propylphenol, o-isopropylphenol, m-isopropylphenol, p-isopropylphenol, o-n-butylphenol, m-n-butylphenol, p-n-butylphenol, o-isobutylphenol, m-isobutylphenol, p-isobutylphenol, octylphenol, nonylphenol, 2,4-xylenol, 2,6-xylenol, 3,5-xylenol, 2,4,6-trimethylphenol, resorcin, catechol, hydroquinone, 4-methoxyphenol, o-phenylphenol, m-phenylphenol, p-phenylphenol, p-cyclohexylphenol, o-allyl-phenol, p-allylphenol, o-benzylphenol, p-benzylphenol, o-chlorophenol, p-chlorophenol, o-bromophenol, p-bromophenol, o-iodophenol, p-iodophenol, o-fluorophenol, m-fluorophenol, and p-fluorophenol.

These phenolic compounds may be used singularly, or by mixing two or more compounds together. Phenol, o-cresol, m-cresol, and p-cresol and the like are particularly preferred.

As the xylylene compound that functions as a bivalent linking group in the production of a phenolic resin of the formula (I), the following xylylene dihalides, xylylene glycols and their derivatives can be used. Namely, examples include α,α'-dichloro-p-xylene, α,α'-dichloro-m-xylene, α,α'-dichloro-o-xylene, α,α'-dibromo-p-xylene, α,α'-dibromo-m-xylene, α,α'-dibromo-o-xylene, α,α'-diiodo-p-xylene, α,α'-diiodo-m-xylene, α,α'-diiodo-o-xylene, α,α'-dihydroxy-p-xylene, α,α'-dihydroxy-m-xylene, α,α'-dihydroxy-o-xylene, α,α'-dimethoxy-p-xylene, α,α'-dimethoxy-m-xylene, α,α'-dimethoxy-o-xylene, α,α'-diethoxy-p-xylene, α,α'-diethoxy-m-xylene, α,α'-diethoxy-o-xylene, α,α'-di-n-propoxy-p-xylene, α,α'-di-n-propoxy-m-xylene, α,α'-di-n-propoxy-o-xylene, α,α'-diisopropoxy-p-xylene, α,α'-diisopropoxy-m-xylene, α,α'-diisopropoxy-o-xylene, α,α'-di-n-butoxy-p-xylene, α,α'-di-n-butoxy-m-xylene, α,α'-di-n-butoxy-o-xylene, α,α'-diisobutoxy-p-xylene, α,α'-diisobutoxy-m-xylene, α,α'-diisobutoxy-o-xylene, α,α'-di-tert-butoxy-p-xylene, α,α'-di-tert-butoxy-m-xylene, and α,α'-di-tert-butoxy-o-xylene, and of these, α,α'-dichloro-p-xylene, α,α'-dichloro-m-xylene, α,α'-dichloro-o-xylene, α,α'-di-hydroxy-p-xylene, α,α'-dihydroxy-m-xylene, α,α'-dihydroxy-o-xylene, α,α'-dimethoxy-p-xylene, α,α'-dimethoxy-m-xylene and α,α'-dimethoxy-o-xylene are preferred. These compounds can be used either singularly, or in combinations of two or more different compounds.

The reaction between the aforementioned phenolic compound and the xylylene compound is conducted using an acid catalyst, suitable examples of which include mineral acids such as hydrochloric acid, sulfuric acid, phosphoric acid, and polyphosphoric acid; organic carboxylic acids such as dimethyl sulfate, diethyl sulfate, p-toluenesulfonic acid, methanesulfonic acid, and ethanesulfonic acid; super strong acids such as trifluoromethanesulfonic acid; strongly acidic ion-exchange resins such as alkanesulfonic acid ion-exchange resins; super strong ion-exchange resins such as perfluoroalkanesulfonic acid ion-exchange resins (brand name: Nafion; manufactured by Du Pont Company); natural and synthetic zeolites; and activated clays (acid clay) and the like, and reaction is conducted at 50 to 250° C. until the raw material xylylene compound is substantially consumed, and the composition of the reaction product becomes constant. Although the reaction time varies depending on the raw materials and the reaction temperature, it is generally within a range from 1 to 15 hours, and in practice, may be determined by tracking the composition of the reaction product using GPC (gel permeation chromatography) or the like.

In the exceptional case where a halogenoxylene derivative such as $\alpha,\alpha'$-dichloro-p-xylene is used, the reaction proceeds in the absence of a catalyst, while generating the corresponding hydrogen halide gas, meaning no acid catalyst is needed. In other cases, the reaction proceeds in the presence of an acid catalyst, and generates water or alcohol, accordingly.

In terms of the molar ratio between the phenolic compound and the xylylene compound in the reaction, generally, the phenolic compound is used in excess, with the unreacted phenolic compound being recovered following completion of the reaction. In this case, the average molecular weight of the product phenolic resin is determined by the quantity used of the phenolic compound, and the greater the excess of the phenolic compound, the lower the average molecular weight of the phenolic resin obtained. A phenolic resin in which the phenolic compound portion is an allylphenol can be obtained by, for example, a method in which a phenolic resin which has not been allylated is first prepared, and allylation is then carried out by reacting this non-allylated resin with an allyl halide to form an allyl ether, which is then subjected to a Claisen conversion.

An epoxy group-containing acrylic copolymer (c) of the present invention comprises from 0.5 to 6% by weight of glycidyl acrylate or glycidyl methacrylate. In order to achieve superior adhesive strength, a quantity of at least 0.5% by weight is preferred, and provided the quantity is no more than 6% by weight, gelation can be suppressed. The glass transition temperature (Tg) of the epoxy group-containing acrylic copolymer (c) is typically within a range from −50° C. to 30° C., and preferably from −10° C. to 30° C.

The quantity of glycidyl acrylate or glycidyl methacrylate used as a functional group monomer represents a copolymerization ratio of 0.5 to 6% by weight. In other words, an epoxy group-containing acrylic copolymer (c) of the present invention refers to a copolymer produced using glycidyl acrylate or glycidyl methacrylate as a raw material, in a quantity equivalent to 0.5 to 6% by weight of the product copolymer (c). As the remaining portion, a mixture of an alkyl acrylate or an alkyl methacrylate containing an alkyl group of 1 to 8 carbon atoms, such as methyl acrylate or methyl methacrylate, and styrene or acrylonitrile can be used. Of these, ethyl(meth)acrylate and/or butyl(meth)acrylate is particularly preferred. The mixing ratio is preferably adjusted with due consideration to the Tg value of the copolymer. If Tg is less than −10° C., the tackiness of the adhesive layer or dicing/die bonding sheet in a B-stage tends to increase, which can cause a deterioration in the handling properties. There are no particular restrictions on the polymerization method used, and suitable methods include pearl polymerization and solution polymerization, and the copolymer is obtained by one of these methods. A specific example of the this type of epoxy group-containing acrylic copolymer is HTR-860P-3 (brand name, manufactured by Nagase ChemteX Corporation).

The weight average molecular weight of the epoxy group-containing acrylic copolymer is typically at least 100,000, as copolymers within this range have excellent adhesiveness and heat resistance, and is preferably within a range from 300,000 to 3,000,000, and preferably from 500,000 to 2,000,000. If the weight average molecular weight is no more than 3,000,000, then the possibility that a fall in the flowability of the copolymer may cause a deterioration in the circuit filling property, for those cases where a wiring circuit has been formed on the support member to which the semiconductor elements are to be bonded, can be reduced. The weight average molecular weight refers to a polystyrene equivalent value obtained by a gel permeation chromatography (GPC) method using a calibration curve obtained for standard polystyrene.

In terms of the quantity added of the epoxy group-containing acrylic copolymer (c), from the viewpoint of reducing the elastic modulus and suppressing the flowability during shaping, a ratio X/Y, wherein X represents the combined weight of the epoxy resin (a) and the phenolic resin (b), and Y represents the weight of the epoxy group-containing acrylic copolymer (c), is preferably within a range from 0.24 to 1. If this blend ratio is at least 0.24, then the elastic modulus at high temperature can be increased to at least 0.5 MPa, the heat resistance improves, and favorable suppression of the flowability during shaping can be achieved, whereas provided the ratio is no more than 1, the copolymer has superior handling properties at high temperature.

In the present invention, a filler (d) and a curing accelerator (e) are also added. Examples of the filler (d) include inorganic fillers and organic fillers, although from the viewpoints of improving handling properties, improving thermal conductivity, adjusting the melt viscosity and imparting thixotropic properties, addition of an inorganic filler is preferred.

There are no particular restrictions on the inorganic filler, and suitable examples include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whiskers, boron nitride, crystalline silica, and amorphous silica. These can be used independently, or in combinations of two or more different fillers. From the viewpoint of improving the thermal conductivity, aluminum oxide, aluminum nitride, boron nitride, crystalline silica, and amorphous silica and the like are preferred. From the viewpoint of balancing the various properties, silica is preferred.

The average particle diameter of the filler (d) is preferably within a range from 0.005 to 0.1 µm, and even more preferably from 0.008 to 0.05 µm, and most preferably from 0.01 to 0.03 µm. If the average particle diameter of the filler is less than 0.005 µm, then both the wettability of the adherend and the adhesiveness tend to deteriorate, whereas if the average particle diameter exceeds 0.1 µm, the reinforcement effect achieved by adding the filler diminishes, and the heat resistance tends to deteriorate. In the present invention, the average particle diameter refers to the average value obtained by measuring the particle diameter of 100 particles of the filler using a TEM or SEM or the like.

Specific examples of the above filler include silica, alumina, and antimony oxide. Silica is commercially available from C. I. Kasei Co., Ltd. under the brand name NanoTek $SiO_2$ (contact angle: 43 degrees, average particle diameter: 0.012 µm), or from Nippon Aerosil Co., Ltd. under the brand name Aerosil R972 (average particle diameter: 0.016 µm). Alumina is commercially available from C. I. Kasei Co., Ltd. under the brand name NanoTek $Al_2O_3$ (contact angle: 55 degrees, average particle diameter: 0.033 µm). Diantimony trioxide is commercially available from Nihon Seiko Co., Ltd. under the brand name PATOX-U (contact angle: 43 degrees, average particle diameter: 0.02 µm).

Furthermore, in the present invention, the blend quantity of the filler (d) is preferably within a range from 3 to 50% by weight, and even more preferably from 10 to 40% by weight, and most preferably from 15 to 30% by weight, relative to the combined weight of the epoxy resin (a) and the phenolic resin (b). If the blend quantity of the filler is less than 3% by weight, then the reinforcement effect achieved by adding the filler diminishes, and the heat resistance tends to fall, whereas if the quantity exceeds 50% by weight, both the wettability of the adherend and the adhesiveness tend to deteriorate.

There are no particular restrictions on the curing accelerator (e) used in an adhesive of the present invention, and suitable examples include tertiary amines, imidazoles, and quaternary ammonium salts and the like. Specific examples of suitable imidazoles, which are preferred in the present invention, include 2-methylimidazole, 2-ethyl-4-methylimidazole, 1-cyanoethyl-2-phenylimidazole, and 1-cyanoethyl-2-phenylimidazolium trimellitate, and these can be used independently, or in combinations of two or more different compounds. Imidazoles are commercially available from, for example, Shikoku Corporation under the brand names 2E4MZ, 2PZ-CN, and 2PZ-CNS.

The blend quantity of the curing accelerator (e) is preferably within a range from 0.01 to 5% by weight, and even more preferably from 0.05 to 3% by weight, and most preferably from 0.2 to 3% by weight, relative to the combined weight of the epoxy resin (a) and the phenolic resin (b). If the blend quantity of the curing accelerator is less than 0.01% by weight, then the epoxy resin undergoes insufficient cross-linking, and the heat resistance tends to deteriorate, whereas if the quantity exceeds 5% by weight, the storage stability worsens, meaning the pot life is more likely to be inadequate.

Furthermore, in the present invention, the cured product of the adhesive preferably has a tensile elastic modulus within a range from 1 to 20 MPa when measured at 240° C. If the tensile elastic modulus exceeds 20 MPa, then the stress relaxation property worsens, increasing the likelihood of warping, whereas if the tensile elastic modulus is less than 1 MPa, the occurrence of reflow cracks becomes more likely.

The measurement of the tensile elastic modulus at 240° C. is conducted in the following manner. First, an adhesive composition with an initial length of 20 mm (L) and a thickness of approximately 50 µm is cured at 170° C. for one hour to prepare a cured film. This cured film is then placed in a thermostatic chamber at 240° C. with a constant load of 1 to 10 kg (W) applied to the cured film. Once the temperature of the cured film in the chamber has reached 240° C., an elongation (ΔL) and a cross-sectional area (S) of the cured film are determined, and the tensile elastic modulus (E') is then calculated from the equation shown below.

$$E'=L\cdot W/(\Delta L\cdot S) \quad\quad\quad [\text{Equation 1}]$$

Furthermore, in order to improve bonding at the interface between different types of materials, a variety of different coupling agents can also be added to the adhesive composition of the present invention. Examples of suitable coupling agents include silane-based, titanium-based, and aluminum-based coupling agents, and silane-based coupling agents are the most preferred. From the viewpoints of effect, heat resistance, and cost, the quantity added of the coupling agent is preferably within a range from 0 to 10 parts by weight per 100 parts by weight of the combined weight of the resin.

As described above, an adhesive layer according to the present invention is formed from a composition comprising an epoxy resin (a), a phenolic resin (b), an epoxy group-containing acrylic copolymer (c), a filler (d), and a curing accelerator (e), and after curing, the components have preferably separated into two phases when viewed through a cross-section of the cured product. The term "two phases" used here indicates that the cured product has an islands-in-sea structure. This "islands-in-sea structure" in the present invention means that when the cross-section of an adhesive composition that has been cured and polished is viewed using a scanning electron microscope or the like, the cross-section reveals a non-uniform structure comprising a continuous phase (referred to as the "sea") and a dispersed phase (referred to as "islands"), as described, for example, on page 16 of "New Polymer Materials, One Point, Polymer Alloys", published by Kyoritsu Shuppan Co., Ltd.

In the adhesive layer of a dicing/die bonding sheet of the present invention, the use of a phenolic resin (b) with a hydroxyl equivalent of at least 150 g/eq. enables a superior level of moisture resistance to be achieved, and the use of an epoxy group-containing acrylic copolymer generates excellent stress relaxation properties. In addition, adding an inorganic filler increases the high temperature elastic modulus and the high temperature peel strength, and also provides a reflow crack prevention effect, enabling the production of an adhesive composition with excellent resistance to reflow cracking.

<Backing Film>

Next is a description of a base film used in a dicing/die bonding sheet of the present invention. The base film preferably has favorable transmittance of radiation, and typically, plastics and rubbers can be favorably employed. Although there are no particular restrictions provided the film transmits radiation, in those cases where the radiation curable pressure-sensitive adhesive is cured by ultraviolet irradiation, a base film that has favorable light transmittance can be selected.

Examples of polymers that can be selected as the base film include α-olefin homopolymers, copolymers, or mixtures thereof, such as polyethylene, polypropylene, ethylene-propylene copolymers, polybutene-1, poly-4-methylpentene-1, ethylene-vinyl acetate copolymers, ethylene-ethyl acrylate copolymers, ethylene-methyl acrylate copolymers, ethylene-acrylic acid copolymers, and ionomers, engineering plastics such as polyethylene terephthalate, polycarbonate, and polymethylmethacrylate, thermoplastic elastomers such as polyurethane, styrene-ethylene-butene or styrene-ethylene-pentene copolymers, and polyamide-polyol copolymers, as well as mixtures of the above polymers.

In order to increase the spacing between elements, a film with minimal necking (the occurrence of partial elongation caused by unfavorable transmission of the force generated during radial stretching of the base film) is preferred, and suitable examples of such films include polyurethane, and styrene-ethylene-butene or styrene-ethylene-pentene copolymers in which the molecular weight and the styrene quantity have been restricted, whereas in order to prevent elongation or flexure during dicing, the use of a cross-linked base film is effective. In terms of achieving powerful ductility characteristics and favorable radiation transmittance, the thickness of the base film is typically within a range from 30 to 300 µm. The opposite surface of the base film to the surface that is coated with the radiation curable pressure-sensitive adhesive layer is preferably either subjected to texturing treatment or is coated with a lubricant coating, as this provides favorable effects such as blocking prevention, and prevention of base film necking caused by a decrease in friction between the adhesive tape and the jig during radial stretching of the tape.

<Method of Manufacturing Dicing/Die Bonding Sheet>

A dicing/die bonding sheet of the present invention comprises a pressure-sensitive adhesive layer and an adhesive layer formed, in that order, on a base film. There are no particular restrictions on the method used for laminating the pressure-sensitive adhesive layer and the adhesive layer on the base film, and conventional techniques can be used to first laminate the pressure-sensitive adhesive layer on the base film, and then laminate the adhesive layer on the pressure-sensitive adhesive layer.

The pressure-sensitive adhesive layer can be formed, for example, by applying the pressure-sensitive adhesive composition directly to the base film and then drying the composition. This application and drying can be conducted in the same manner as that described in the following method for forming an adhesive layer on the base film.

Subsequently, in order to laminate an adhesive layer on the pressure-sensitive adhesive layer, a temporary support film with an adhesive layer formed thereon (hereafter referred to as the "adhesive film") and the base film with the pressure-sensitive adhesive layer formed thereon (hereafter referred to as the "adhesive sheet") are laminated together with the pressure-sensitive adhesive layer surface and the adhesive layer surface in contact, and the temporary support film is then removed. The conditions for the lamination preferably include a temperature of 10 to 100° C., and a linear pressure of 1 to 100 kgf/cm.

The aforementioned adhesive layer is obtained by first dissolving or dispersing the materials contained within the adhesive layer in a solvent to generate a varnish, subsequently applying this varnish to a support film such as a polytetrafluoroethylene film or a release-treated polyethylene terephthalate film, and then heating and drying the varnish to remove the solvent, thereby forming an adhesive layer on the support film. The heating conditions for this process preferably employ a temperature of 80 to 250° C. for a period of 10 minutes to 20 hours.

As the above support film, plastic films such as polytetrafluoroethylene film, polyethylene terephthalate film, polyethylene film, polypropylene film, polymethylpentene film, and polyimide film can be used, and these plastic films can also be release-treated prior to use.

The support film can either be peeled off at the time of use, so that only the adhesive layer is used, or the adhesive layer can be used with the support film laminated, and the support film then removed later.

Known methods can be used for applying the varnish to the support film, and suitable methods include knife coating methods, roll coating methods, spray coating methods, gravure coating methods, bar coating methods, and curtain coating methods.

Although there are no particular restrictions on the thickness of the adhesive layer, the thickness is preferably within a range from 3 to 300 µm, even more preferably from 5 to 250 µm, even more preferably from 10 to 200 µm, and most preferably from 20 to 100 µm. If the thickness is less than 3 µm, then the stress relaxation effect tends to deteriorate, whereas if the thickness exceeds 300 µm, the layer becomes uneconomic.

Although there are no particular restrictions on the solvent used for forming the varnish, from the viewpoint of facilitating volatilization during the film preparation, it is preferable to use a solvent with a comparatively low boiling point, such as methyl ethyl ketone, acetone, methyl isobutyl ketone, 2-ethoxyethanol, toluene, xylene, butyl cellosolve, methanol, ethanol, or 2-methoxyethanol. Furthermore, in order to improve the coating properties, a solvent with a comparatively high boiling point, such as dimethylacetamide, dimethylformamide, N-methylpyrrolidone, or cyclohexanone can also be added.

In the present invention, from the viewpoint of dispersibility of the filler (d), the use of a mixer, a three-roll mill, a ball mill, or a beads mill or the like is preferred, and these can also be used in combination. Furthermore, by first mixing the filler and low molecular weight compounds together, and then blending in the polymer compounds, the mixing time can be shortened. After the varnish is prepared, air bubbles within the varnish are preferably removed by vacuum deaeration or the like. Furthermore, in the present invention, the adhesive composition is preferably produced using a method in which the epoxy resin (a), the phenolic resin (b), and the filler (d) are first mixed together, and the epoxy group-containing acrylic copolymer (c) and the curing accelerator (e) are then mixed into the resulting mixture. Furthermore, in order to obtain the desired thickness, an adhesive layer of the present invention may also comprise two or more layers. In such a case, these layers are laminated together under conditions that ensure no peeling between the adhesive layers.

Figure 2:
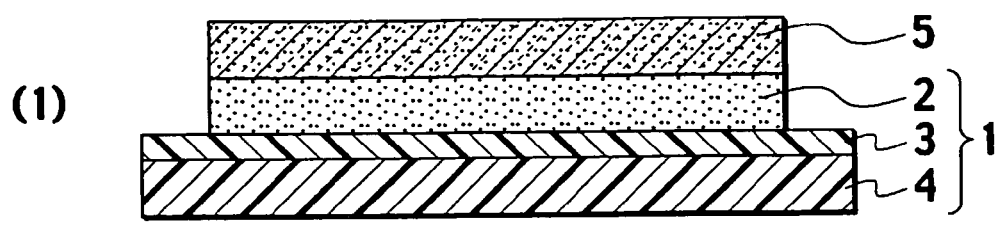
FIG. 2 is a series of cross-sectional schematic illustrations showing a sample method of using a dicing/die bonding sheet of the present invention.
Figure 2:
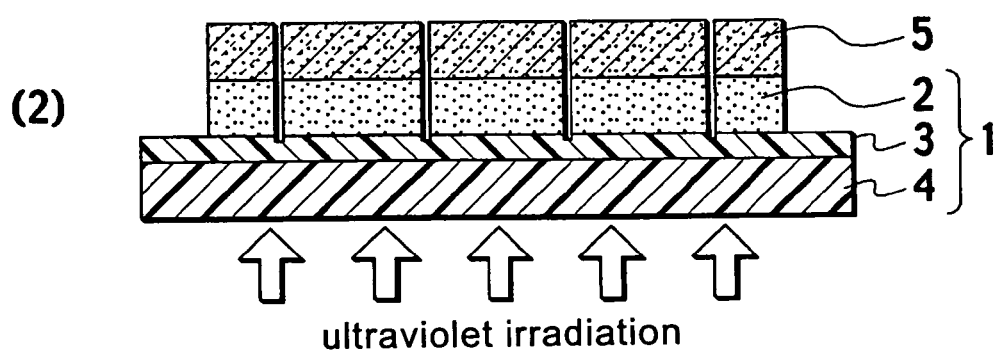
Figure 2:
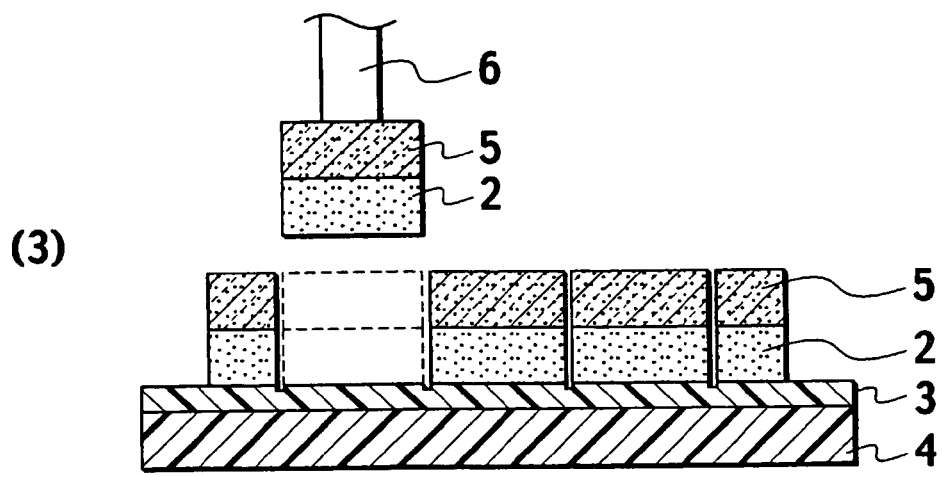
Figure 3:
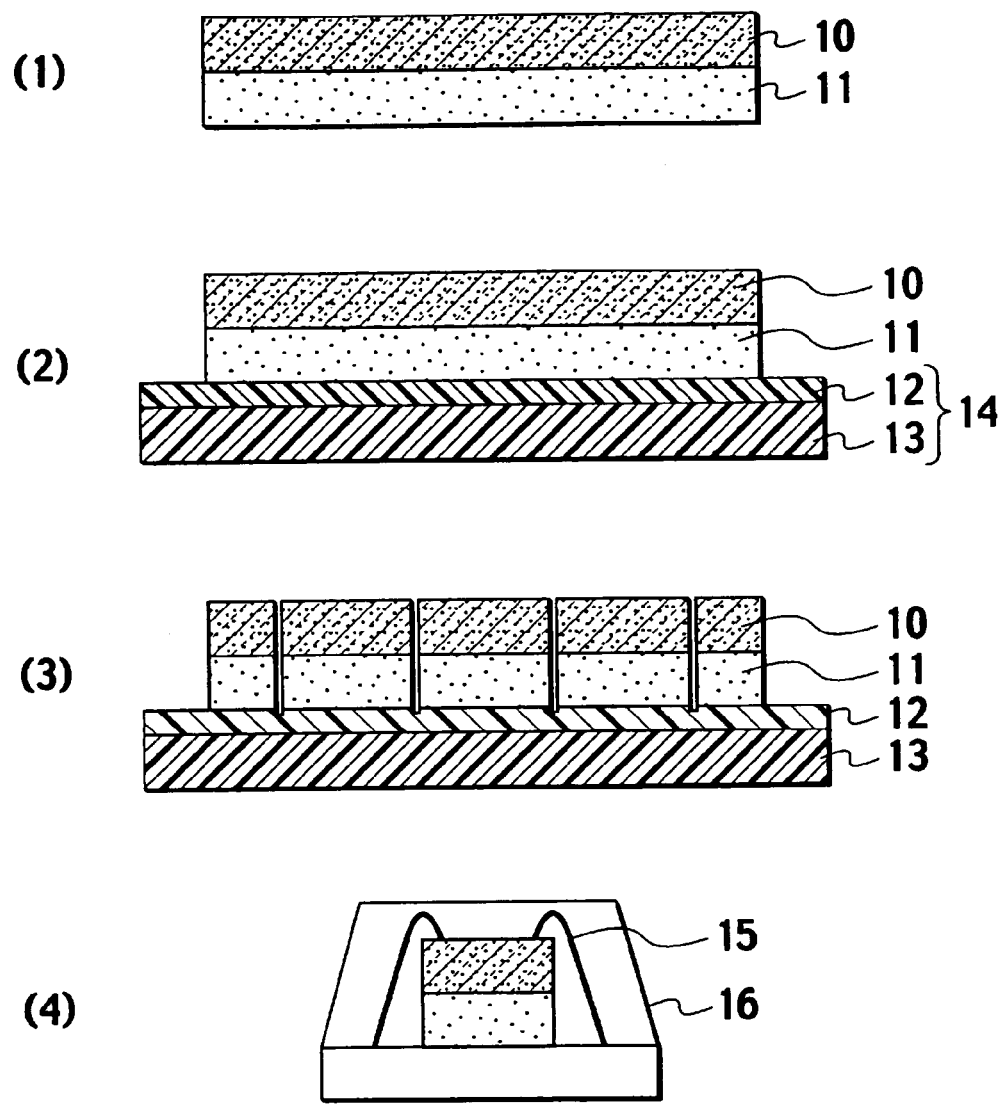
FIG. 3 is a series of cross-sectional schematic illustrations showing a conventional method of manufacturing a semiconductor device.

An example of a method of using a dicing/die bonding sheet of the present invention is shown in FIG. 2. First, a dicing/die bonding sheet 1 is laminated to the backside of a semiconductor wafer 5 with the adhesive layer 2 contacting the wafer (1). Next, dicing is conducted to segment the structure into individual elements (2). At this time, light irradiation is conducted, either prior to, or following dicing, with the time of irradiation selected in accordance with factors such as the properties of the pressure-sensitive adhesive layer 3. Finally, a pickup device 6 is used for pickup, thus yielding an element with an adhesive layer (3). Subsequently, this element is bonded (die bonded) to a support member, and then subjected to a series of processes such as the wiring of metal wire and heat curing, thereby forming a semiconductor device.

A dicing/die bonding sheet of the present invention can be laminated to a semiconductor wafer and used as a dicing tape during dicing, enables the ready separation of the semiconductor element and the adhesive layer from the pressure-sensitive adhesive layer during pickup, and because the adhesive layer has satisfactory adhesiveness as a die bonding material, also enables direct die bonding of semiconductor elements.

EXAMPLES

As follows is a more detailed description of the present invention based on a series of examples, although the present invention is in no way limited by the examples presented below.

Radiation curable pressure-sensitive adhesives were prepared as described below in examples 1 to 6 and comparative examples 1 to 3, and were each then applied to an ethylene-vinyl acetate copolymer film in the manner described below, thus forming an adhesive tape. Subsequently, an adhesive film prepared in advance in the manner described below was laminated to the pressure-sensitive adhesive layer of the adhesive tape, yielding a dicing/die bonding sheet.

The properties of the dicing/die bonding sheets prepared in this manner were tested and evaluated. These properties were evaluated in the following manner.

1) Peel Strength

This is an indicator of the ease with which the laminated adhesive film and adhesive tape are able to be peeled apart. Prior to ultraviolet irradiation, in order to ensure that the wafer chip is held through the dicing process, a value of at least 0.8 N/25 mm is considered acceptable, whereas following ultraviolet irradiation, a value of no more than 0.5 N/25 mm is considered.

A dicing/die bonding sheet was laminated, for 10 seconds, to a 5-inch diameter silicon that had been heated to 80° C. on a hot plate, and the peel strength prior to, and then following ultraviolet irradiation was measured in accordance with JIS-0237 (90° peeling, peel speed 50 mm/min.).

2) Pickup Success Rate

Following lamination of a dicing/die bonding sheet to a wafer by heating at 80° C. for 1 hour, the wafer was diced into 10 mm×10 mm chips. The pressure-sensitive adhesive layer was then irradiated with ultraviolet light from an air-cooled high pressure mercury lamp (80 W/cm, irradiation distance 10 cm), at an irradiation dose of 200 mJ/cm$^2$, a pickup test was then conducted using a die bonder apparatus (product name: CPS-100FM, manufactured by NEC Machinery Corporation), and the pickup success rate was determined for 100 pickup chips. In this test, those picked up elements that separated from the pressure-sensitive adhesive layer but retained the adhesive layer were treated as successful pickups.

(Preparation of Pressure-Sensitive Adhesive Compositions 1 to 6, and 11 to 12)

A mixed liquid of 128 g of n-butyl acrylate, 307 g of 2-ethylhexyl acrylate, 67 g of methyl methacrylate, 1.5 g of methacrylic acid, and benzoyl peroxide as a polymerization initiator was added dropwise to 400 g of toluene solvent with suitable control of the addition rate, the reaction temperature, and the reaction time, thus yielding a solution of a compound ((2)) with functional groups.

To this polymer solution was added, as a compound ((1)) containing a radiation curable carbon-carbon double bond and also containing a functional group, 2.5 g of 2-hydroxyethyl methacrylate, prepared in a separate synthesis from methacrylic acid and ethylene glycol, and hydroquinone as a polymerization inhibitor, and by suitable control of the rate of dropwise addition, the reaction temperature, and the reaction time, a solution of a compound (A) containing radiation curable carbon-carbon double bonds was obtained, with an iodine value, a molecular weight, and a glass transition temperature shown in Table 1. Subsequently, to 100 parts by weight of the compound (A) within this solution were added the number of parts by weight shown in Table 1 of Coronate L, manufactured by Nippon Polyurethane Industry Co., Ltd., as the polyisocyanate (B), 0.5 parts by weight of Irgacure 184, manufactured by Nippon Ciba Geigy Co., Ltd., as a polymerization initiator, and 150 parts by weight of ethyl acetate as a solvent, and the resulting mixture was mixed together, yielding the radiation curable pressure-sensitive adhesive compositions 1 to 6, and the pressure-sensitive adhesive compositions 11 and 12.

(Preparation of Pressure-Sensitive Adhesive Composition 13)

The materials used in the preparation of the compound (A) used in the pressure-sensitive adhesive compositions 1 to 6, and 11 to 12 were combined, without reaction, with the compound (B), thereby yielding a pressure-sensitive adhesive composition 13.

The iodine value was calculated based on the Das method, using reaction conditions of 40° C. for 24 hours. The molecular weight was determined by measuring a 1% solution of the composition dissolved in tetrahydrofuran using gel permeation chromatography (brand name: 150-C ALC/GPC, manufactured by Waters Corporation), and using the measured value to calculate the polystyrene equivalent average molecular weight. Furthermore, the hydroxyl value was calculated using an FT-IR method, and the acid value was calculated in accordance with section 11.1 of JIS K 5407.

These values were calculated using the same methods for the pressure-sensitive adhesive compositions and the comparative examples described below.

(Preparation of Adhesive Tape)

The pressure-sensitive adhesive compositions 1 to 6 and the pressure-sensitive adhesive compositions 11 to 13 were each applied to an ethylene-vinyl acetate copolymer film of thickness 100 μm, in sufficient quantity to generate a dried film thickness of 10 μm, and were then dried for 3 minutes at 110° C., thus yielding adhesive tapes 1 to 6 and adhesive tapes 11 to 13.

(Preparation of an Adhesive Film 1)

To a composition comprising 55 parts by weight of YDCN-703 (brand name, manufactured by Tohto Kasei Co., Ltd, a cresol novolak type epoxy resin, epoxy equivalent: 210, molecular weight: 1200, softening point: 80° C.) as the epoxy resin, 45 parts by weight of Milex XLC-LL (brand name, manufactured by Mitsui Chemicals Inc., a phenolic resin of the formula (I), hydroxyl equivalent: 175, coefficient of water absorption: 1.8%, weight loss by heating at 350° C.: 4%) as the phenolic resin, 1.7 parts by weight of NUC A-189 (brand name, manufactured by Nippon Unicar Co., Ltd., γ-mercaptopropyltrimethoxysilane) and 3.2 parts by weight of NUC A-1160 (brand name, manufactured by Nippon Unicar Co., Ltd., γ-ureidopropyltriethoxysilane) as silane coupling agents, and 32 parts by weight of Aerosil R972 (brand name of Nippon Aerosil Co., Ltd., a silica filler with organic groups such as methyl groups at the surface, produced by coating the surface of silica with dimethyldichlorosilane, and then conducting hydrolysis in a reaction vessel at 400° C., average particle diameter: 0.016 μm) as the filler was added cyclohexanone, and following stirring, the resulting mixture was further mixed for 90 minutes using a beads mill.

To this mixture were added 280 parts by weight of an acrylic rubber containing 3% by weight of glycidyl acrylate or glycidyl methacrylate HT-860P-3 (brand name, manufactured by Nagase ChemteX Corporation, weight average molecular weight: 800,000), and 0.5 parts by weight of Curezol 2PZ-CN (brand name, manufactured by Shikoku Corporation, 1-cyanoethyl-2-phenylimidazole) as the curing accelerator, and the resulting mixture was stirred, and then vacuum deaerated, yielding a varnish.

The varnish was applied to a release-treated polyethylene terephthalate film of thickness 35 μm, and then dried by heating at 140° C. for 5 minutes, thus forming a B-stage coating film of thickness 10 μm, and completing preparation of an adhesive film 1 equipped with a carrier film.

If the combined weight of the epoxy resin (a) and the phenolic resin (b) in the adhesive layer is termed X, and the weight of the epoxy group-containing acrylic copolymer (c) is termed Y, then the ratio X/Y is 0.357, and the tensile elastic modulus at 240' is 2.5 MPa.

Examples 1 to 6

Samples of the adhesive film 1 were laminated to the adhesive tapes described above to prepare the dicing/die bonding sheets of the examples 1 to 6 and the comparative examples 1 to 3 shown in Table 1, and the properties of these sheets were then evaluated.

As shown in the examples 1 through 6, with the dicing/die bonding sheets prepared by laminating the adhesive film 1 to an adhesive tape produced using one of the pressure-sensitive adhesive compositions 1 to 6, irradiation following dicing causes a satisfactory reduction in the peel strength of the pressure-sensitive adhesive layer, meaning during pickup, the structure separates between the pressure-sensitive adhesive layer and the adhesive layer, resulting in a favorable pickup success rate. Furthermore, with these dicing/die bonding sheets, even if the entire dicing/die bonding sheet is irradiated following dicing, a satisfactory spacing can still be retained between elements when the dicing/die bonding sheet is subjected to radial stretching, meaning image recognition of individual elements during pickup is simple.

Comparative Examples 1 to 3

In contrast, as shown in the comparative examples 1 through 3, with the dicing/die bonding sheets prepared by laminating the adhesive film 1 to an adhesive tape produced using one of the pressure-sensitive adhesive compositions 11 to 13, irradiation following dicing does not generate a satisfactory reduction in the peel strength of the pressure-sensitive adhesive layer, meaning the adhesive layer is unable to be separated from the pressure-sensitive adhesive layer in some cases, causing a dramatic fall in the element pickup success rate.

TABLE 1

| | | Example | | | | | |
|---|---|---|---|---|---|---|---|
| | | 1 | 2 | 3 | 4 | 5 | 6 |
| Pressure-sensitive adhesive composition | | 1 | 2 | 3 | 4 | 5 | 6 |
| Compound (A) | Iodine value | 1 | 1 | 0.8 | 2 | 4 | 1 |
| | Molecular weight | 500,000 | 700,000 | 460,000 | 900,000 | 600,000 | 400,000 |
| | Hydroxyl value | 40 | 35 | 56 | 23 | 0 | 120 |
| | Acid value | 10 | 6 | 6 | 5 | 40 | 0 |
| | Tg (° C.) | −60 | −65 | −20 | −64 | −30 | −53 |
| Compound (B) | Name | B1 | B1 | B1 | B1 | B1 | B1 |
| | Blend quantity (parts by weight) | 1 | 1 | 2 | 2 | 2 | 3 |
| Adhesive film | | 1 | 1 | 1 | 1 | 1 | 1 |
| Peel strength between pressure-sensitive adhesive layer and adhesive layer (N/25 mm) | Prior to UV | 1.0 | 1.3 | 1.5 | 1.2 | 1.5 | 1.4 |
| | Following heating at 80° C. for 1 hour, and UV | 0.08 | 0.09 | 0.11 | 0.10 | 0.12 | 0.13 |
| Pickup success rate (%) | | 100 | 100 | 100 | 100 | 100 | 100 |

B1: Coronate L

TABLE 2

|  |  | Comparative Example | | |
|---|---|---|---|---|
|  |  | 1 | 2 | 3 |
| Pressure-sensitive adhesive composition | | 11 | 12 | 13 |
| Compound (A) | Iodine value | 0.1 | 0.1 | The compound (A) |
|  | Molecular weight | 500,000 | 5,000 | of the example 1 |
|  | Hydroxyl value | 0 | 35 | was replaced with |
|  | Acid value | 0 | 6 | a mixture |
|  | Tg (° C.) | −60 | −65 | |
| Compound (B) | Name | B1 | B1 | B1 |
|  | Blend quantity (parts by weight) | 1 | 1 | 1 |
| Adhesive film | | 1 | 1 | 1 |
| Peel strength between pressure-sensitive adhesive layer and adhesive layer (N/25 mm) | Prior to UV | 1.4 | 2.0 | 2.1 |
| | Following heating at 80° C. for 1 hour, and UV | 2.0 | 0.8 | At least 20 Peeling was impossible |
| | Pickup success rate (%) | 0 | 10 | 0 |

B1: Coronate L

The invention claimed is:

1. A dicing/die bonding sheet comprising a pressure-sensitive adhesive layer and an adhesive layer formed, in that order, on a base film, wherein said pressure-sensitive adhesive layer comprises a compound (A), containing at least one intramolecular, radiation curable carbon-carbon double bond with an iodine value of 0.5 to 20, and at least one compound (B) selected from a group consisting of polyisocyanates, melamine-formaldehyde resins, and epoxy resins, and said adhesive layer comprises an epoxy resin (a), a phenolic resin (b) with a hydroxyl equivalent of at least 150 g/eq., an epoxy group-containing acrylic copolymer (c), comprising from 0.5 to 6% by weight of glycidyl acrylate or glycidyl methacrylate, and with a weight average molecular weight of at least 100,000, a filler (d), and a curing accelerator (e).

2. The dicing/die bonding sheet according to claim 1, wherein a glass transition temperature of said compound (A) is within a range from −70° C. to 0° C.

3. The dicing/die bonding sheet according to claim 1, wherein a hydroxyl value of said compound (A) is within a range from 5 to 100.

4. The dicing/die bonding sheet according to claim 1, wherein an acid value of said compound (A) is within a range from 0.5 to 30.

5. The dicing/die bonding sheet according to claim 1, wherein a hydroxyl value of said compound (A) is within a range from 5 to 100, and an acid value is within a range from 0.5 to 30.

6. The dicing/die bonding sheet according to claim 1, wherein when a combined weight of said epoxy resin (a) and said phenolic resin (b) is termed X, and a weight of said epoxy group-containing acrylic copolymer (c) is termed Y, then a ratio X/Y is within a range from 0.24 to 1.

7. The dicing/die bonding sheet according to claim 1, wherein said phenolic resin (b) is represented by a general formula (l):

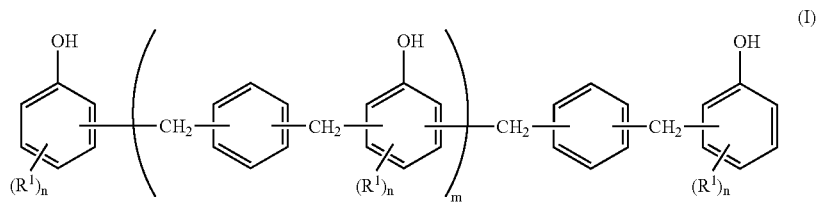

(wherein, groups $R^1$ are either identical or different, and each represents a hydrogen atom, a straight chain or branched alkyl group of 1 to 10 carbon atoms, a cyclic alkyl group, an aralkyl group, an alkenyl group, a hydroxyl group, an aryl group, or a halogen atom, n represents an integer from 1 to 3, and m represents an integer from 0 to 50).

8. The dicing/die bonding sheet according to claim 1, wherein an average particle diameter of said filler (d) is within a range from 0.005 μm to 0.1 μm.

9. The dicing/die bonding sheet according to claim 1, wherein said filler (d) is a silica filler.

10. The dicing/die bonding sheet according to claim 1, wherein said curing accelerator (e) is an imidazole.

11. The dicing/die bonding sheet according to claim 1, wherein said epoxy resin (a) has an epoxy equivalent of 100 to 2,000 g/eq.

12. The dicing/die bonding sheet according to claim 1, wherein said hydroxyl equivalent of the phenolic resin (b) is 150 to 400 g/eq.

13. The dicing/die bonding sheet according to claim 1, wherein said hydroxyl equivalent of the phenolic resin (b) is 180 to 300 g/eq.

14. The dicing/die bonding sheet according to claim 1, wherein said hydroxyl equivalent of the phenolic resin (b) is 180 to 250 g/eq.

15. The dicing/die bonding sheet according to claim 1, wherein after curing, components of said adhesive layer separate to form an islands-in-sea structure.

* * * * *